United States Patent
Bizen et al.

(10) Patent No.: US 10,262,830 B2
(45) Date of Patent: Apr. 16, 2019

(54) SCANNING ELECTRON MICROSCOPE AND ELECTRON TRAJECTORY ADJUSTMENT METHOD THEREFOR

(71) Applicant: HITACHI, LTD., Chiyoda-ku, Tokyo (JP)

(72) Inventors: Daisuke Bizen, Tokyo (JP); Hideo Morishita, Tokyo (JP); Michio Hatano, Tokyo (JP); Hiroya Ohta, Tokyo (JP)

(73) Assignee: HITACHI, LTD., Tokyo (JP)

( * ) Notice: Subject to any disclaimer, the term of this patent is extended or adjusted under 35 U.S.C. 154(b) by 37 days.

(21) Appl. No.: 15/529,281

(22) PCT Filed: Nov. 26, 2014

(86) PCT No.: PCT/JP2014/081222
§ 371 (c)(1),
(2) Date: May 24, 2017

(87) PCT Pub. No.: WO2016/084157
PCT Pub. Date: Jun. 2, 2016

(65) Prior Publication Data
US 2017/0263415 A1    Sep. 14, 2017

(51) Int. Cl.
*H01J 37/26* (2006.01)
*H01J 37/147* (2006.01)
(Continued)

(52) U.S. Cl.
CPC ............ *H01J 37/263* (2013.01); *H01J 37/05* (2013.01); *H01J 37/10* (2013.01);
(Continued)

(58) Field of Classification Search
CPC .......... H01J 37/263; H01J 37/05; H01J 37/10; H01J 37/1472; H01J 37/28;
(Continued)

(56) References Cited

U.S. PATENT DOCUMENTS

| 7,928,381 B1 * | 4/2011 | Kelly | H01J 37/05 250/305 |
| 2002/0030166 A1 | 3/2002 | Hiroi et al. | |

(Continued)

FOREIGN PATENT DOCUMENTS

| JP | 2001-236916 A | 8/2001 |
| JP | 2001-319612 A | 11/2001 |

(Continued)

*Primary Examiner* — Nicole M Ippolito
(74) *Attorney, Agent, or Firm* — Miles & Stockbridge P.C.

(57) ABSTRACT

To provide a scanning electron microscope having an electron spectroscopy system to attain high spatial resolution and a high secondary electron detection rate under the condition that energy of primary electrons is low, the scanning electron microscope includes: an objective lens 105; primary electron acceleration means 104 that accelerates primary electrons 102; primary electron deceleration means 109 that decelerates the primary electrons and irradiates them to a sample 106; a secondary electron deflector 103 that deflects secondary electrons 110 from the sample to the outside of an optical axis of the primary electrons; a spectroscope 111 that disperses secondary electrons; and a controller that controls application voltage to the objective lens, the primary electron acceleration means and the primary electron deceleration means so as to converge the secondary electrons to an entrance of the spectroscope.

12 Claims, 9 Drawing Sheets

(51) Int. Cl.
*H01J 37/10* (2006.01)
*H01J 37/285* (2006.01)
*H01J 37/28* (2006.01)
*H01J 37/05* (2006.01)
*H01J 37/21* (2006.01)
*H01J 37/244* (2006.01)

(52) U.S. Cl.
CPC .......... *H01J 37/1472* (2013.01); *H01J 37/21* (2013.01); *H01J 37/244* (2013.01); *H01J 37/28* (2013.01); *H01J 37/285* (2013.01); *H01J 2237/0473* (2013.01); *H01J 2237/0475* (2013.01); *H01J 2237/057* (2013.01); *H01J 2237/1534* (2013.01); *H01J 2237/24485* (2013.01); *H01J 2237/2806* (2013.01); *H01J 2237/2823* (2013.01)

(58) Field of Classification Search
CPC ....... H01J 2237/0473; H01J 2237/0475; H01J 2237/057; H01J 2237/1534; H01J 2237/2806; H01J 2237/2823

USPC ..... 250/396 R, 397, 306, 307, 309, 310, 311
See application file for complete search history.

(56) References Cited

U.S. PATENT DOCUMENTS

2010/0163725 A1\* 7/2010 Barkshire ............... H01J 37/05
250/305
2011/0240855 A1 10/2011 Ohshima et al.
2016/0148782 A1\* 5/2016 Agemura ............. H01J 37/244
250/310

FOREIGN PATENT DOCUMENTS

| JP | 2002-42712 A | 2/2002 |
| JP | 2002-260574 A | 9/2002 |
| JP | 2014-146526 A | 8/2014 |
| WO | WO 2010/070837 A1 | 6/2010 |

\* cited by examiner

SCANNING ELECTRON MICROSCOPE AND ELECTRON TRAJECTORY ADJUSTMENT METHOD THEREFOR

TECHNICAL FIELD

The present invention relates to a scanning electron microscope (hereinbelow SEM) having an electron spectroscopy system and its electron orbit control method.

BACKGROUND ART

Currently, the SEM is widely used for observation of a sample having a size ranging from submicron order to nanometer order. The SEM forms an image by irradiating a sample with primary electrons emitted from an electron source while scanning the primary electrons, and detecting secondary electrons caused in the sample. Note that the secondary electrons are divided into "true" secondary electrons characterized in that they have energy equal to or lower than 50 eV and backscattered electrons having energy about the same as incident energy of the primary electrons. A contrast image reflecting the shape of pattern surface, the potential, the difference in work function and the like is obtained from the "true" secondary electrons. On the other hand, a contrast image reflecting the difference in composition and crystal orientation of the sample is obtained from the backscattered electrons.

In recent years, SEMs commercialized as products by respective companies are equipped with plural detectors to obtain various contrast images. On the other hand, image contrast interpretation has become difficult, and there is an increasing need for quantitative analyses of secondary electron energy detected under respective conditions. In addition, to reduce sample damage accompanying observation of sample top surface and irradiation of primary electrons and image disorder due to electrical charge, it is required to perform energy analyses of secondary electrons under the condition that irradiation energy of the primary electrons is low. The techniques of secondary electron energy spectroscopy are disclosed in, e.g., Patent Literatures 1 and 2.

CITATION LIST

Patent Literature

Patent Literature 1: Japanese Unexamined Patent Application Publication No. 2001-236916
Patent Literature 2: Japanese Unexamined Patent Application Publication No. 2001-319612

SUMMARY OF INVENTION

Technical Problem

As a method for energy spectroscopy of secondary electrons in a SEM, as disclosed in Patent Literature 1, a method of installation of a spectroscope between an objective lens and a sample in the SEM is known. However, in the structure of Patent Literature 1, it is difficult to shorten the distance between the objective lens and the sample (hereinbelow, working distance). As a result, there is a problem that the spatial resolution of the primary electrons is degraded.

On the other hand, as a structure to shorten the working distance and disperse the secondary electrons passed through the objective lens, a structure disclosed in Patent Literature 2 is known. However, in the structure of Patent Literature 2, the secondary electrons spread and enter the spectroscope with the electromagnetic field of the objective lens. There is a problem that the detection rate of the secondary electrons is degraded.

The present invention has an object to provide a scanning electron microscope having an electron spectroscopy system with high spatial resolution and a high secondary electron detection rate under condition that especially the primary electron energy is low, and its electron orbit control method.

Solution to Problem

As an embodiment to attain the above-described object, there is provided a scanning electron microscope including:
an electron source;
an objective lens that converges primary electrons emitted from the electron source on a sample;
primary electron acceleration means that accelerates the primary electrons and passes them through the objective lens;
primary electron deceleration means that decelerates the primary electrons and irradiates them to the sample;
a secondary electron deflector that deflects secondary electrons from the sample, caused from the primary electrons converged with the objective lens, to the outside of an optical axis of the primary electrons;
a spectroscope for dispersion of the secondary electrons;
a detector that detects secondary electrons passed through the spectroscope; and
a controller that controls application voltage to at least one of the objective lens, the primary electron acceleration means and the primary electron deceleration means so as to converge the secondary electrons to an entrance of the spectroscope, with a lens formed with the objective lens, the primary electron acceleration means and the primary electron deceleration means.

Further, there is provided an electron orbit control method using the scanning electron microscope,
wherein excitation current for the objective lens and application voltage to the primary electron acceleration means and the primary electron deceleration means are set so as to obtain a spectrum of the secondary electrons with the detector at the highest signal/noise ratio.

Further, there is provided a scanning electron microscope comprising:
an electron source;
an objective lens that converges primary electrons emitted from the electron source on a sample;
primary electron acceleration means that accelerates the primary electrons and passes them through the objective lens;
primary electron deceleration means that decelerates the primary electrons and irradiates them to the sample;
a secondary electron deflector that deflects secondary electrons from the sample, caused with the primary electrons converged with the objective lens, to the outside of an optical axis of the primary electrons;
a spectroscope for dispersion of the secondary electrons;
a first detector that detects the secondary electrons passed through the spectroscope;
a second detector that detects tertiary electrons caused by irradiation of the secondary electrons to an entrance slit of the spectroscope; and
a controller that controls application voltage to the secondary electron deflector so as to scan the secondary electrons on the entrance slit, to obtain a scan image of the entrance slit using a detection signal of the tertiary electrons detected with the second detector.

Further, there is provided an electron orbit control method in the scanning electron microscope, comprising:

a first step of applying voltage to the primary electron acceleration means;

a second step of deflecting the secondary electrons with the secondary electron deflector to the spectroscope side;

a third step of detecting the tertiary electrons with the second detector, to obtain a scan image of an entrance slit of the spectroscope;

a fourth step of calculating sharpness of the scan image;

a step of repeating the first step to the fourth step; and a step of setting voltage of the primary electron acceleration means to obtain the highest sharpness as application voltage to the primary electron acceleration means.

Advantageous Effects of Invention

According to the present invention, it is possible to provide a scanning electron microscope having an electron spectroscopy system with high spatial resolution and high a secondary electron detection rate and its electron orbit control method.

DESCRIPTION OF EMBODIMENTS

As a method for obtaining high spatial resolution under the condition that the energy of primary electrons is low, the retarding method of applying negative polarity voltage (hereinbelow, retarding voltage) $V_r(<0)$ to a sample to decelerate the primary electrons above the sample is effective. In the regarding method, typically several kV negative voltage $V_r$ is applied to the sample.

In addition, the boosting method of accelerating primary electrons upon passing through an objective lens to reduce the chromatic aberration in the objective lens is also effective in improvement in spatial resolution of the primary electrons. In the boosting method, typically the primary electrons are accelerated with several kV positive polarity voltage (hereinbelow, booster voltage) $V_b(>0)$ and passed through the magnetic field of the objective lens.

The electromagnetic field, formed on the optical axis with the objective lens to which the boosting method and the retarding method are applied, also contributes to convergence of secondary electrons which pass through the objective lens in addition to the primary electrons. Accordingly, when the boosting voltage, the retarding voltage and the objective lens excitation are set with appropriate conditions, it is possible to converge the primary electrons in the position of the sample, and at the same time, to converge the secondary electrons passed through the objective lens in the position of a spectroscope installed on the electron gun side from the objective lens. In this case, it is possible to attain high spatial resolution and a high secondary electron detection rate. Note that the secondary electrons, passed through the objective lens, are deflected with a secondary electron deflector to the outside of the optical axis, and enter the spectroscope.

Hereinbelow, embodiments to implement the present invention will be described in detail with reference to the drawings. Note that the same reference numerals indicate the same constituent elements.

First Embodiment

Figure 1:
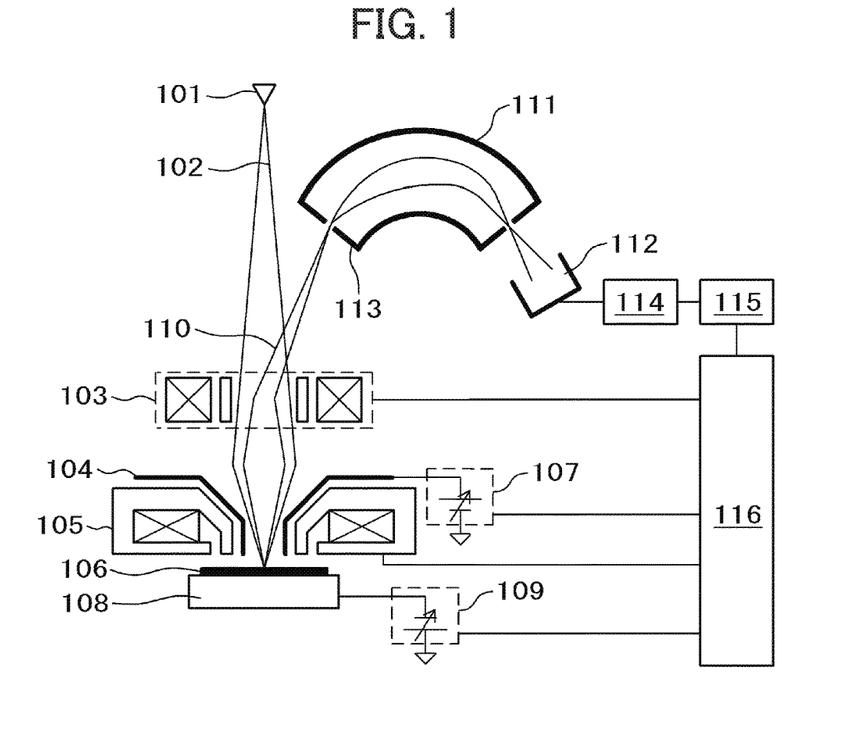
FIG. 1 is an entire configuration diagram of an SEM according to a first embodiment of the present invention.
Figure 2:
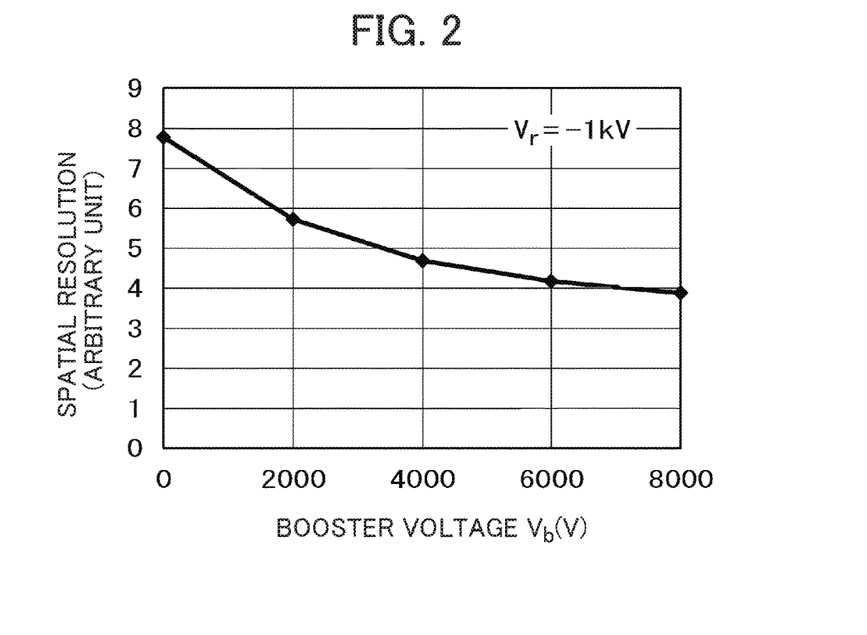
FIG. 2 is a diagram for explaining the influence of booster voltage on spatial resolution.
Figure 3:
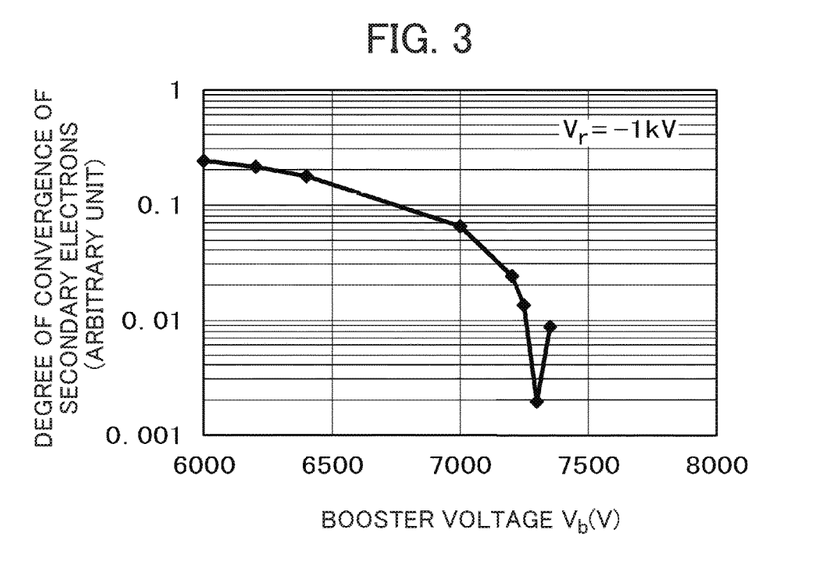
FIG. 3 is a diagram for explaining the influence of the booster voltage on secondary electrons.

A first embodiment of the present invention will be described using FIG. 1 to FIG. 3. FIG. 1 is a diagram showing the configuration of an SEM according to the present embodiment. In FIG. 1, primary electrons 102 generated with an electron source 101, pass through a secondary electron deflector 103, then pass through a booster electrode 104 for acceleration of the primary electrons and an objective lens 105, and irradiated to a sample 106. Note that positive polarity voltage is applied from a booster power source 107 to a booster electrode 104. In the electric fields caused with the booster electrode 104, an electric field formed at an end on the sample side is overlapped with a magnetic field caused with the objective lens 105. Hereinbelow, $V_b(>0)$ holds as the voltage applied from the booster power source 107.

In the present embodiment, an example using, as the configuration of the objective lens 105, a snorkel type objective lens in which the magnetic field of the objective lens is leaked to the sample 106, will be described. A similar effect is obtained with a single pole type objective lens, using a sample chamber as a part of magnetic path, which also forms a leakage magnetic field on the periphery of the sample. Further, a similar effect to that obtained in the present embodiment is obtained with an out-lens type objective lens with which the magnetic field is not leaked to the sample 106.

The sample 106 is placed on a sample holder 108. The sample 106 and the sample holder 108 are electrically in contact with each other. It is possible to apply retarding voltage from a retarding power source 109 to the sample holder 108. The primary electrons 102 are decelerated with the retarding electric field, and enter the sample 106. Hereinbelow, $V_r(<0)$ holds as the voltage applied from the retarding power source 109.

Secondary electrons 110, caused by irradiation of the sample 106 with the primary electrons 102, are accelerated with the electric field with the booster voltage and the retarding voltage, then deflected with the secondary electron deflector 103 to the outside of the optical axis of the primary electrons 102. Note that the secondary electron deflector 103 is an optical device in which an electric field and a magnetic field are perpendicular to each other. The sizes of the electric field and the magnetic field are set with conditions that the primary electrons 102 are not deflected with the secondary electron deflector 103 (hereinbelow, Wien conditions).

Under the Wien conditions, the secondary electrons 110, which enter the secondary electron deflector 103 from an opposite direction to the primary electrons 102, are deflected with the secondary electron deflector 103 to the outside of the optical axis. The secondary electrons 110 deflected to the outside of the optical axis enter the spectroscope 111. Here a sector type spectroscope is used. The spectroscope 111 has a characteristic that only secondary electrons 110 having specific energy $E_p$ pass through. The secondary electrons 110 passed through the spectroscope 111 are detected with a first detector 112. The signal from the first detector 112 is displayed through a first signal processor 114 on a display unit 115, to allow a user to check.

It is possible to control the voltage and current values of the secondary electron deflector 103, the objective lens 105, the booster power source 107 and the retarding power source 109 with a controller 116. Further, the voltage and current values applied to the secondary electron deflector 103, the objective lens 105, the booster power source 107 and the retarding power source 109 are displayed on the display unit 115, to allow the user to check. Further, the voltage and current values of the secondary electron deflector 103, the objective lens 105, the booster power source 107 and the retarding power source 109 are set by the user to arbitrary values through the display unit 115.

In the present embodiment, an example using two cylindrical electrodes as the configuration of the spectroscope 111 will be described. It is also possible to obtain the effect of the present embodiment by using a spectroscope having other shape such as hemispherical shape. Further, it is also possible to obtain the effect of the present embodiment by using a deflection type spectroscope using a magnetic field in place of electric field.

Since a lens effect occurs with the electric field by application of the booster voltage and the retarding voltage, the focus of the objective lens is shortened in comparison with a case without voltage application. Accordingly, the spatial resolution of the primary electrons 102 is improved. As a specific example, FIG. 2 shows the result of simulation of the relationship between the booster voltage and the spatial resolution. Note that the acceleration voltage for the primary electrons 102 is 2.5 kV, and the voltage $V_r$ is −1 kV. From FIG. 2, it is understood that the spatial resolution is improved in accordance with application of the voltage $V_b$. Since the primary electrons 102 are accelerated with the booster electric field and pass through the objective lens 105, the chromatic aberration and spherical aberration are reduced.

As described above, the booster electric field and the retarding electric field also have convergence effect with respect to the secondary electrons 110. FIG. 3 shows the result of simulation of the relationship between the booster voltage $V_b$ and the degree of convergence of the secondary electrons. Note that the degree of convergence of the secondary electrons is defined as variation of arrival position of the secondary electrons 110 emitted from the sample 106, with energy 2 eV and in a direction of 40° from the optical axis, in the entrance slit 113 of the spectroscope 111. As in the case of FIG. 2, the voltage $V_r$ is −1 kV. From FIG. 3, it is found that the degree of convergence of the secondary electrons is improved by several digits by controlling the voltage $V_b$. Since the number of electrons passing through the opening of the entrance slit 113 is increased in accordance with convergence of the secondary electrons, by setting the voltage $V_b$ to 7.3 kV, more secondary electrons 110 pass through the entrance slit 113 (improvement in number of digits). As a result, the signal/noise ratio of the spectrum obtained with the spectroscope 111 is improved.

That is, by controlling the excitation current for the objective lens 105, the booster voltage and the retarding voltage applied with the booster power source 107 and the retarding power source 109, with the controller 116, it is possible to converge the primary electrons 102 to the sample 106, and the secondary electrons 110, to the entrance slit 113, simultaneously. More specifically, the excitation current for the objective lens, the booster voltage and the retarding voltage may be set to values to obtain maximum signal/noise ratio with the spectroscope 111.

Note that in the present embodiment, the method for controlling the degree of convergence of the primary electrons with the excitation current for the objective lens 105, and the degree of convergence of the secondary electrons, with the voltage value of the booster power source 107, has been described. However, the primary electrons and the secondary electrons may be converged with other combinations. For example, the degree of convergence of the primary electrons may be controlled with the voltage value of the retarding power source 109, and the degree of convergence of the secondary electrons may be controlled with the excitation current value for the objective lens 105.

By using the SEM shown in FIG. 1, it was possible to attain the improvement in secondary electron detection rate while maintaining high spatial resolution by converging the primary electrons by with the excitation current for the objective lens, and converging the secondary electrons by controlling the voltage value of the booster power source.

As described above, according to the present embodiment, it is possible to provide a scanning electron microscope having an electron spectroscopy system with high spatial resolution and high a secondary electron detection rate under the condition that the energy of the primary electrons is low, and its electron orbit control method.

Second Embodiment

A second embodiment of the present invention will be described using FIG. 4 to FIG. 6. Note that the matter described in the first embodiment but not described in the present embodiment is applicable to the present embodiment unless there are special circumstances.

Figure 4:
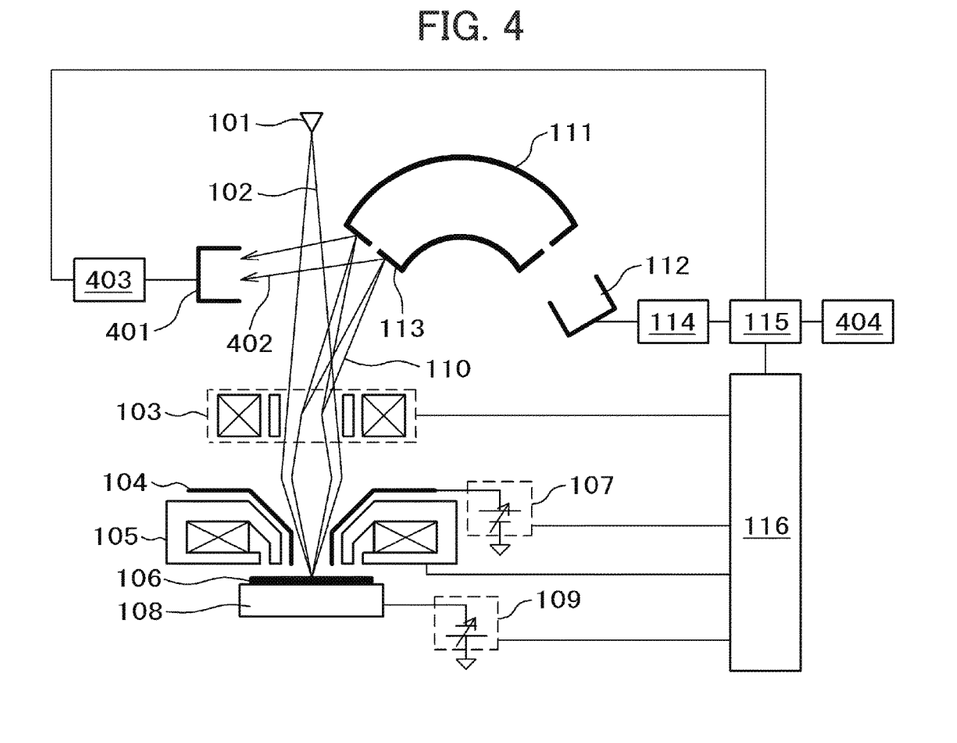
FIG. 4 is an entire configuration diagram of the SEM according to a second embodiment of the present invention.

FIG. 4 is a diagram showing the configuration of the SEM according to the present embodiment. In the present embodiment, a second detector 401, a second signal processor 403 and an image processor 404 are added to the configuration of the first embodiment shown in FIG. 1. The second detector 401 is installed on the opposite side to the spectroscope 111 with the optical axis of the primary electrons 102 between them. The second detector 401 detects first tertiary electrons 402 caused by collision of the secondary electrons 110 against the entrance slit 113. The signal from the second detector 401 is displayed on the display unit 115 through the second signal processor 403 to allow the user to check.

In the configuration shown in the first embodiment, it is difficult to determine whether or not the secondary electrons 110 are converged and passed through the center of the entrance slit 113. In the configuration disclosed in the present embodiment, it is possible to simply determine the optimum convergence condition of the secondary electrons 110. That is, an SEM image of the entrance slit 113 is obtained by scanning the secondary electrons 110 with the secondary electron deflector 103 on the entrance slit 113, to detect the first tertiary electrons 402 caused in the entrance slit 113 with the second detector 401. Next, the optimum convergence condition is determined from the sharpness of the SEM image of the entrance slit 113.

Figure 5:
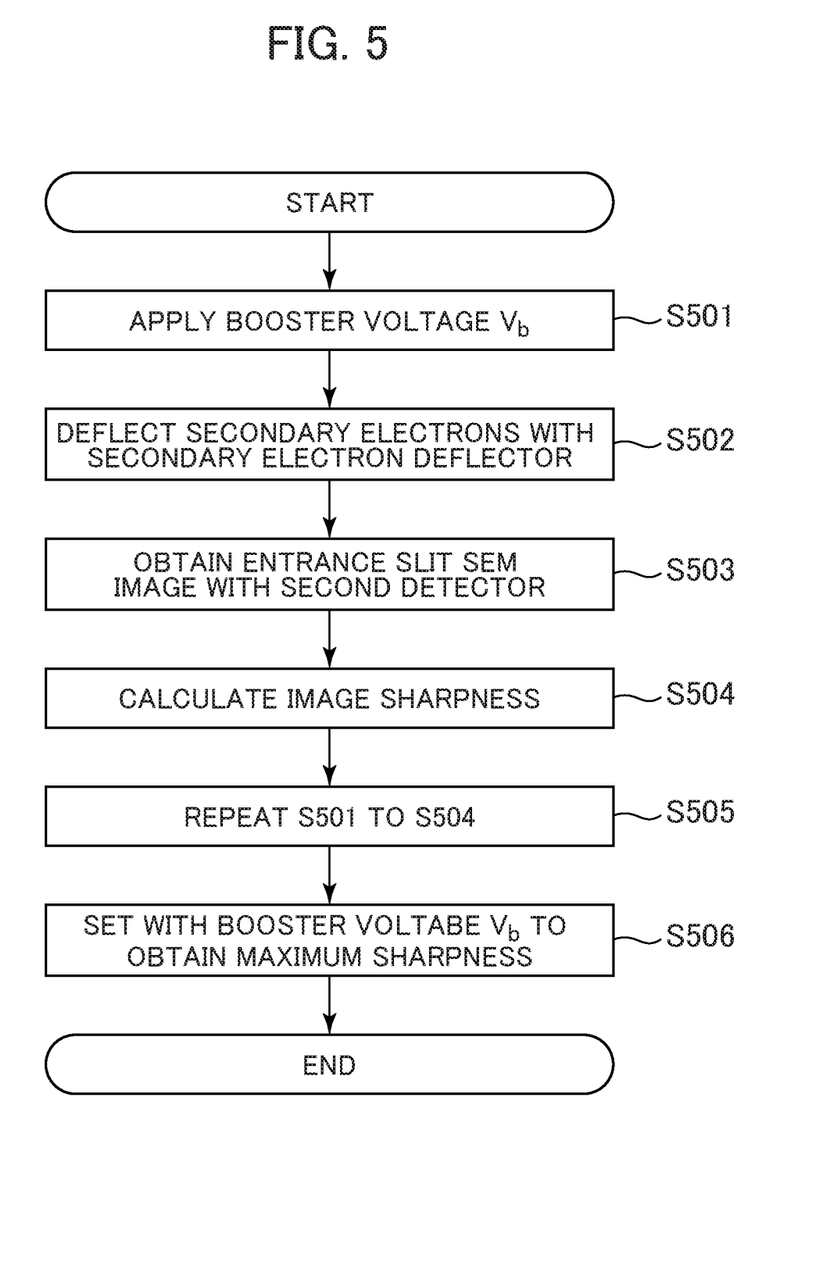
FIG. 5 is a flowchart for determining an optimum convergence condition of secondary electrons included in an electron orbit control method in the SEM shown in FIG. 4.
Figure 6:
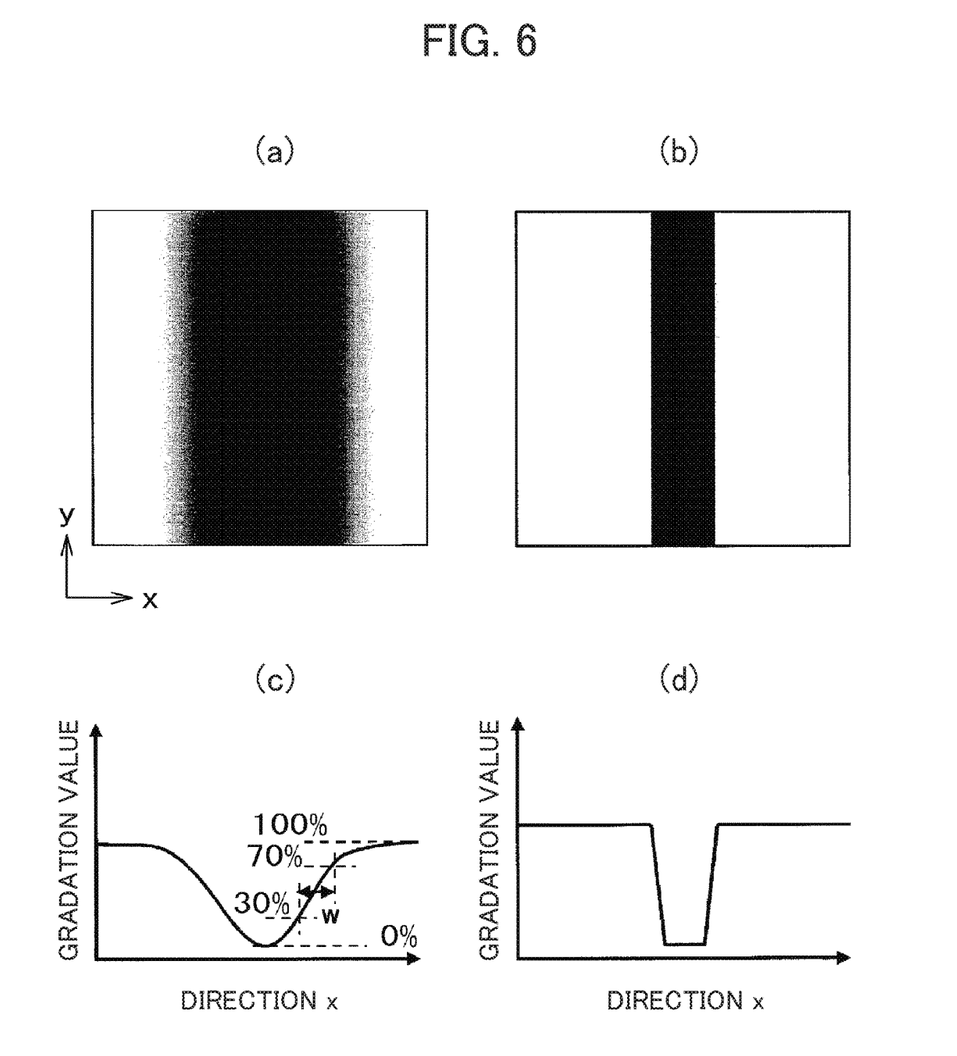
FIG. 6 is a diagram for explaining entrance slit SEM images in the SEM shown in FIG. 4: (a) is an entrance slit SEM image when the secondary electrons are not converged; (b) is an entrance slit SEM image when the secondary electrons are converged; (c) is a line profile of the SEM image in (a) in a direction x; and (d) is a line profile of the SEM image in (b) in the direction x.

FIG. 5 shows a specific optimum convergence condition determination flow included in the electron orbit control method in the SEM shown in FIG. 4. First, the booster voltage $V_b$ is applied (S501), to deflect the secondary electrons 110 with the secondary electron deflector 103, and scan the electrons on the entrance slit 113 (S502). Next, the SEM image of the entrance slit 113 is obtained by detecting the first tertiary electrons 402 caused in the entrance slit 113 with the second detector 401 (S503). FIG. 6 shows examples of the SEM image of the entrance slit 113. FIGS. 6(a) and (b) are SEM images of the entrance slit 113, respectively, at booster voltage $V_{b1}$ where the secondary electrons are not converged, and booster voltage $V_{b2}$ where the secondary electrons are converged. The reason why the left and right parts of the SEM image are bright is that the secondary electrons 110 collide against the entrance slit 113 and many first tertiary electrons 402 are caused. On the other hand, the reason why the central part of the SEM image is dark is that a major part of the secondary electrons 110 passes through the opening of the entrance slit 113 and almost no first tertiary electron 402 is caused. The boundary between the entrance slit 113 and the opening of the entrance slit 113 becomes sharp in accordance with promotion of the convergence of the secondary electrons 110. Accordingly, it is possible to evaluate the convergence of the secondary electrons 110 by obtaining the sharpness from the SEM image in FIG. 6. In the present embodiment, as the sharpness, regarding the SEM images shown in FIGS. 6(a) and (b), a line profile is generated in a direction x (FIGS. 6(c) and (d)), with a maximum value of the line profile as 100% and a minimum value as 0%, the inverse number of a width w between 30% and 70% is defined as the sharpness. At S504, the sharpness of the SEM image obtained at S503 is calculated. Then S501 to S504 are repeated regarding different booster voltage $V_b$ (S505). Finally, setting is made to the booster voltage $V_b$ to obtain the highest sharpness (S506). With the above-described flow, it is possible to obtain booster voltage $V_b$ at which the secondary electrons 110 are most converged. Note that the process to calculate the sharpness of the SEM image is performed with the image processor 404.

The above-described sharpness is not limited to the definition in the present embodiment as long as it is an index to represent the sharpness of an SEM image. For example, a maximum value of the inclination of the line profile may be used as the sharpness. Further, in the flow shown in FIG. 5, the booster voltage $V_b$ may be changed to the retarding voltage $V_r$. Note that when the retarding voltage $V_r$ is varied, the incident energy of the primary electrons 102 to the sample 106 and the incident energy of the secondary electrons 110 to the spectroscope 111 are also varied. Accordingly, it is desirable to vary the booster voltage $V_b$.

By using the SEM shown in FIG. 4, it is possible to improve the secondary electron detection rate while maintain high spatial resolution, by converging the primary electrons with the excitation current for the objective lens, and regarding the secondary electrons, by setting the booster voltage to that to obtain high sharpness of the SEM image of the entrance slit 113 in accordance with the flow shown in FIG. 5.

As described above, according to the present embodiment, it is possible to obtain a similar effect to that obtained in the first embodiment. Further, by acquisition of an SEM image with tertiary electrons from the entrance slit of the spectroscope by the secondary electrons, it is possible to check the degree of convergence of the secondary electrons and to obtain the energy spectrum of the secondary electrons. With this configuration, the collection efficiency and the reliability of the energy spectrum of the secondary electrons are improved.

Third Embodiment

A third embodiment of the present invention will be described using FIG. 7 to FIG. 11. Note that the matter described in the first or second embodiment but not described in the present embodiment is applicable to the present embodiment unless there are special circumstances.

Figure 7:
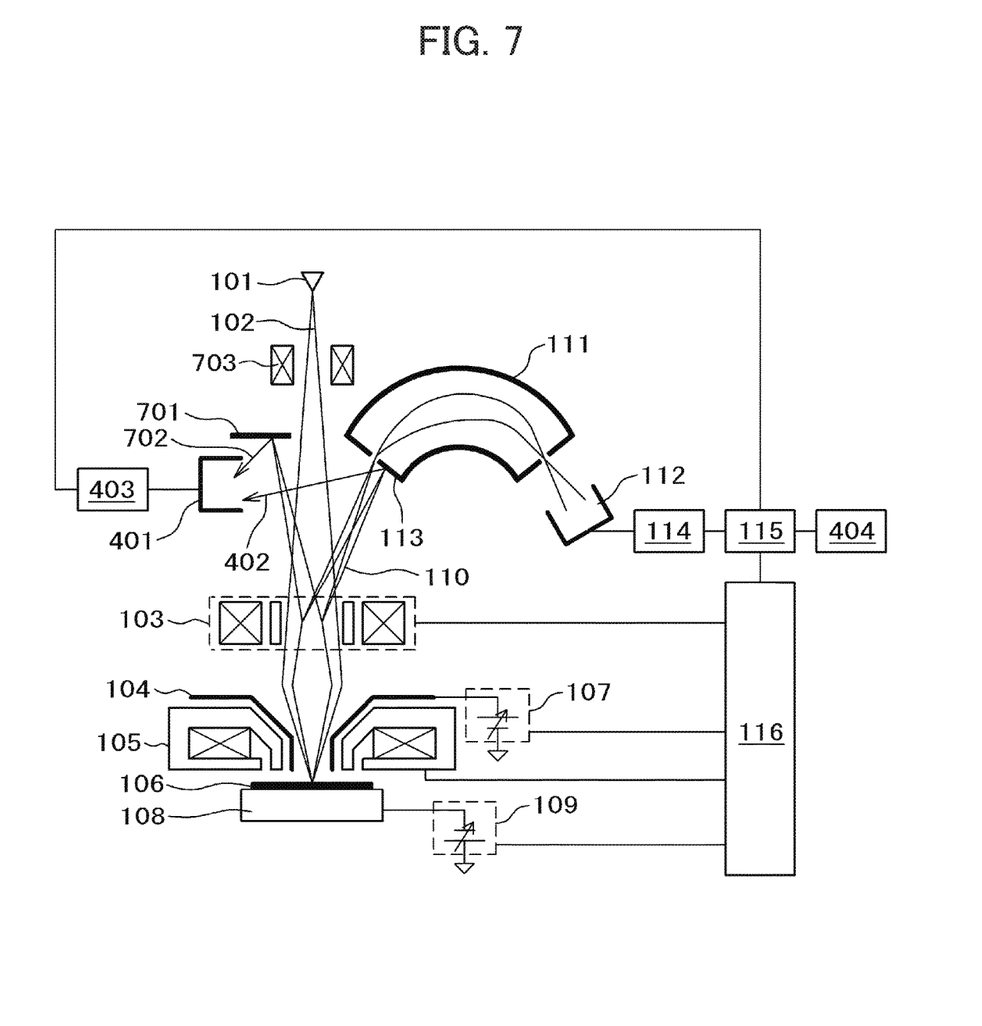
FIG. 7 is an entire configuration diagram of the SEM according to a third embodiment according to the present invention.

FIG. 7 is a diagram showing the configuration of the SEM according to the present embodiment. In the present embodiment, a conversion plate 701 and a deflector 703 to deflect the primary electrons 102 are added to the configuration of the second embodiment shown in FIG. 4. The conversion plate 701 is installed on the opposite side to the spectroscope 111 with the optical axis of the primary electrons 102 between them. The conversion plate generates second tertiary electrons 702 when the secondary electrons 110 collide against it. The second tertiary electrons 702 are detected with the second detector 401 as in the case of the first tertiary electrons 402. The deflector 703 scans the primary electrons 102 on the sample 106, and use them to obtain an SEM image of the sample 106.

The spectroscope 111 is an optical device to pass electrons having specific energy. Accordingly, only some of the secondary electrons 110 emitted from the sample 106 arrive at the first detector 112. Accordingly, if an SEM image of the sample 106 is obtained by using the first detector 112, the image has a very low signal/noise ratio.

In the present embodiment, as a general SEM, when the shape of the sample 106 is observed, the secondary electrons 110 are deflected to the conversion plate 701 side with the secondary electron deflector 103. When the spectrum of the sample 106 is obtained, the secondary electrons 110 are deflected to the spectroscope 111 side with the secondary electron deflector 103. With this configuration, it is possible to realize the both of the application of observation of the sample shape as a general SEM and the application of acquisition of secondary electron spectrum, under the same irradiation condition of the primary electrons 102. Note that upon spectrum acquisition, the secondary electrons 110 are converged to the entrance slit 113 using the method disclosed in the second embodiment.

Figure 8:
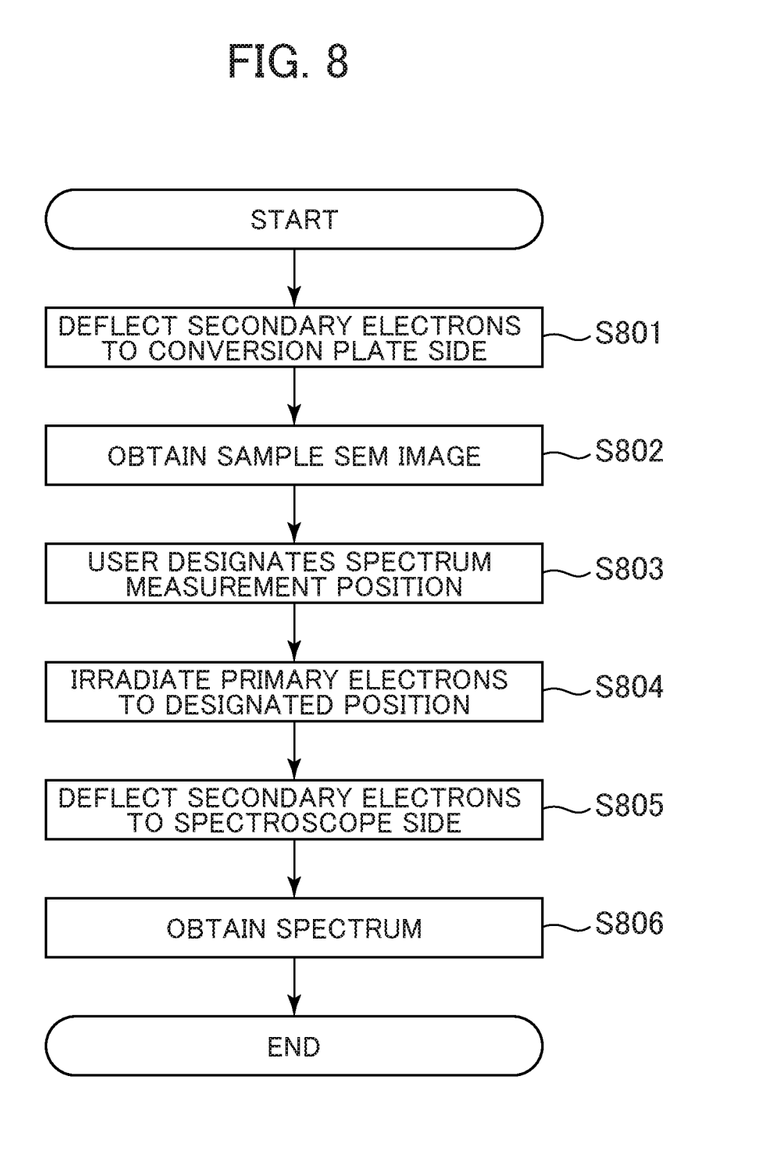
FIG. 8 is a flowchart for explaining a sample measurement procedure using the SEM shown in FIG. 7.
Figure 9:
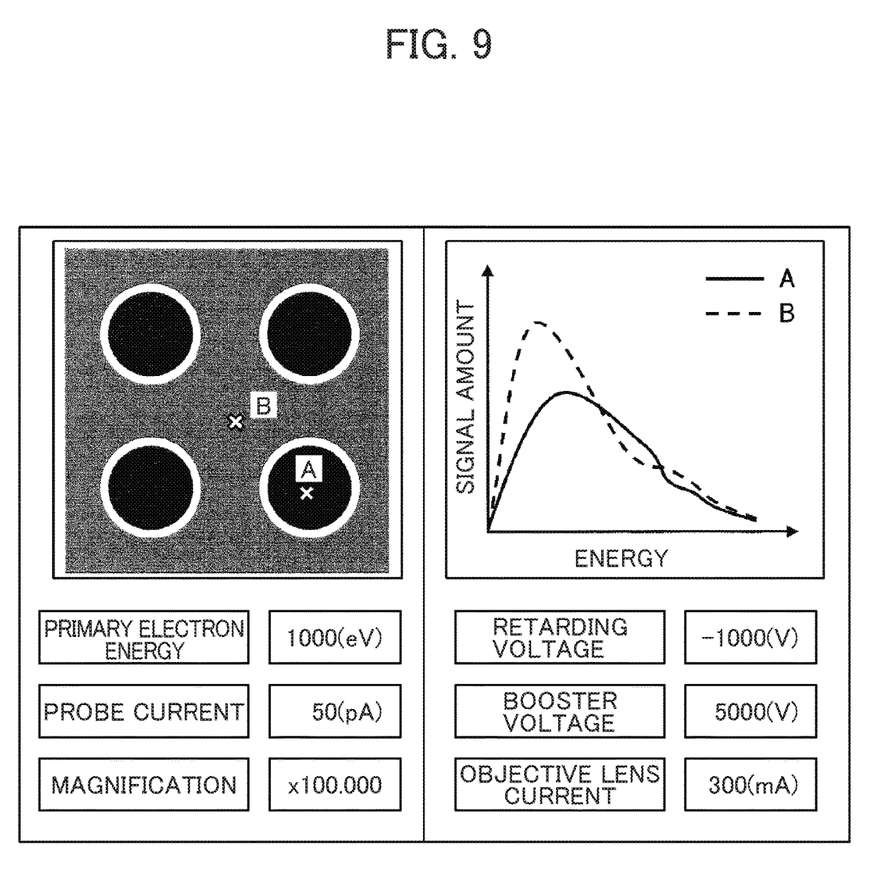
FIG. 9 is a diagram for explaining an image display part of the SEM shown in FIG. 7.

FIG. 8 shows a specific measurement flow for explaining a sample measurement procedure using the SEM shown in FIG. 7. First, the secondary electrons 110 are deflected to the conversion plate 701 side (S801), and an SEM image of the sample 106 is obtained (S802). The obtained SEM image is displayed on the display unit 115. The user designates a spectrum measurement position from the displayed SEM image (S803). Note that the user may designate plural positions such as point A and point B shown in FIG. 9 as the spectrum measurement position by using GUI or the like. Next, the primary electrons 102 are irradiated with the deflector 703 to the designated position (S804). Thereafter, the secondary electrons 110 are deflected to the spectroscope 111 side (S805), to obtain a secondary electron spectrum (S806). The obtained secondary electron spectrum is displayed on the display unit 115 as in the case of the SEM image (FIG. 9).

Upon observation of the sample 106, when, e.g., the excitation current for the objective lens 105 and the booster voltage are varied, the convergence of the secondary electrons 110 in addition to the primary electrons 102 is changed. In the present embodiment, a method for obtaining optimum convergence conditions of the primary electrons 102 and the secondary electrons 110 using the SEM shown in FIG. 7 is shown.

Figure 10:
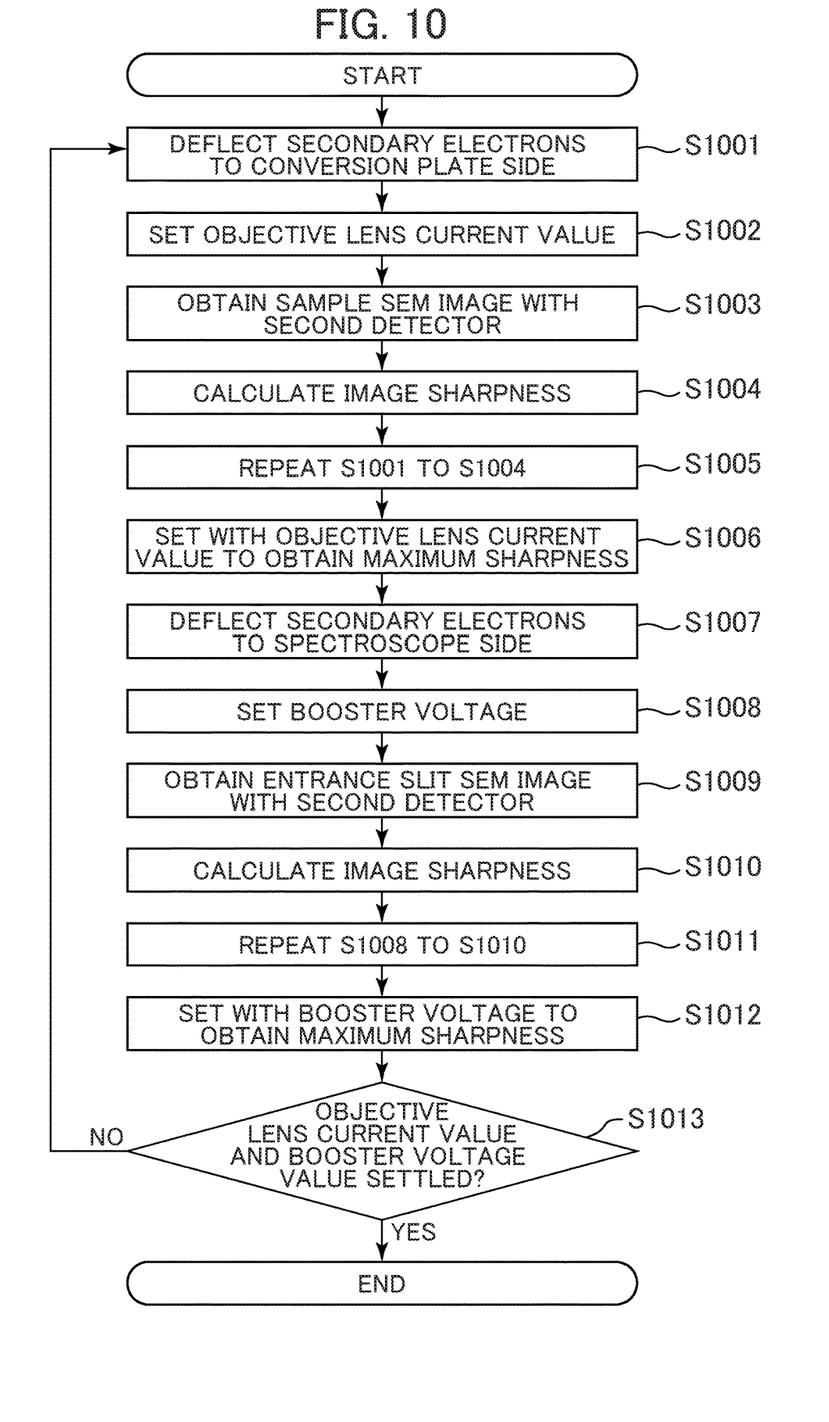
FIG. 10 is a flowchart to obtain optimum convergence conditions of the primary electrons and the secondary electrons included in the electron orbit control method in the SEM shown in FIG. 7.

FIG. 10 shows a flow to obtain optimum convergence conditions of the primary electrons 102 and the secondary electrons 110. First, the secondary electrons 110 are deflected to the conversion plate 701 side (S1001). The excitation current value for the objective lens is set (S1002). The SEM image of the sample 106 is obtained with the second detector 401 (S1003). Then the sharpness of the obtained image is calculated (S1004). Note that the sharpness of the image is obtained by the same method as that described in the second embodiment. S1001 to S1004 are repeated until the image sharpness becomes the maximum (S1005), and setting is made with an excitation current value for the objective lens to obtain the maximum sharpness (S1006). Next, the secondary electrons 110 are deflected to the spectroscope 111 side (S1007), the booster voltage is set (S1008), and an SEM image of the entrance slit 113 is obtained with the second detector 401 (S1009). As in the case of S1004, the sharpness of the SEM image of the entrance slit 113 is obtained (S1010). S1008 to S1010 are repeated until the sharpness becomes the maximum (S1011). Then setting is made with booster voltage to obtain maximum sharpness (S1012). When the booster voltage is changed, the convergence of the primary electrons is changed. Accordingly, the flow from S1001 to S1012 is repeated until the objective lens current value and the booster voltage value are settled, thus the optimum convergence condition is determined.

In the flow of FIG. 10, when two different variables among the retarding voltage, the booster voltage and the excitation current for the objective lens are combined, e.g., the variable changed at S1002 is the retarding voltage and the variable changed at S1008 is the excitation current for the objective lens, it is possible to obtain an equivalent effect to that in the present embodiment.

Figure 11:
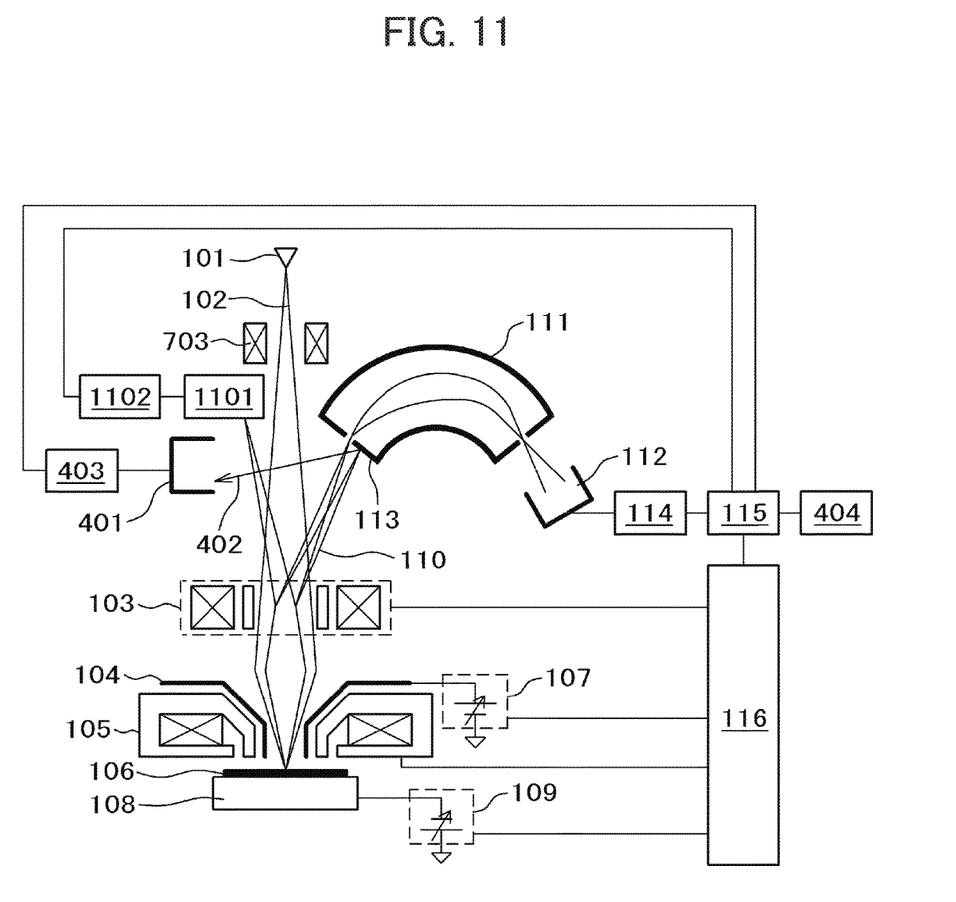
FIG. 11 is a diagram for explaining a configuration without a conversion plate in the SEM according to the third embodiment.

In the present embodiment, the SEM image of the sample 106 is obtained by detecting the second tertiary electrons 702 caused with the conversion plate 701 with the second detector 401. As shown in FIG. 11, it is possible to obtain an equivalent effect to that in the present embodiment by replacing a conversion plate 701 with a third detector 1101 such as a semiconductor detector, and directly detecting the secondary electrons 110 caused in the sample 106 with the third detector 1101. In this case, a scan image of the entrance slit 113 is obtained with the second detector 401. The signal from the third detector 1101 is displayed on the display unit 115 through a third signal processor 1102 as in the case of the other detectors, to allow the user to check.

When the primary electrons and the secondary electrons are converged with the SEM shown in FIG. 7 and in accordance with the flow diagrams shown in FIG. 8 and FIG. 10, and the secondary electron spectrum is obtained, it is possible to improve the secondary electron detection rate while maintain high spatial resolution, and to easily specify a desired position of the sample. Accordingly, it is possible to obtain the secondary electron spectrum in the desired position in short time.

As described above, according to the present embodiment, it is possible to obtain similar effects to those in the first and second embodiments. Further, it is possible to check a desired position on the sample and then obtain the secondary electron spectrum.

Note that the present invention is not limited to the above-described embodiments, but includes various modifications. For example, the above embodiments have been described in detail for explaining the present invention, and the invention is not necessarily limited to an embodiment having all the described constituent elements. Further, some of constituent elements of an embodiment may be replaced with those of another embodiment. Further, constituent elements of an embodiment may be added to those of another embodiment. Further, it is possible to perform addition/deletion/replacement with respect to some of constituent elements of the respective embodiments with other constituent elements.

LIST OF REFERENCE SIGNS

101 . . . electron source, 102 . . . primary electron, 103 . . . secondary electron deflector, 104 . . . booster electrode, 105 . . . objective lens, 106 . . . sample, 107 . . . booster power source, 108 . . . sample holder, 109 . . . retarding power source, 110 . . . secondary electron, 111 . . . spectroscope, 112 . . . detector (first detector), 113 . . . entrance slit, 114 . . . signal processor (first signal processor), 115 . . . display unit, 116 . . . controller, 401 . . . second detector, 402 . . . tertiary electron (first tertiary electron), 403 . . . second signal processor, 404 . . . image processor, 701 . . . conversion plate, 702 . . . second tertiary electron, 703 . . . deflector, 1101 . . . third detector, 1102 . . . third signal processor.

The invention claimed is:

1. A scanning electron microscope comprising:
an electron source;
an objective lens that converges primary electrons emitted from the electron source on a sample;
primary electron acceleration means that accelerates the primary electrons and passes them through the objective lens;
primary electron deceleration means that decelerates the primary electrons and irradiates them to the sample;
a secondary electron deflector that deflects secondary electrons from the sample, caused from the primary electrons converged with the objective lens, to the outside of an optical axis of the primary electrons;
a spectroscope for dispersion of the secondary electrons;
a detector that detects secondary electrons passed through the spectroscope; and
a controller that controls application voltage to at least one of the objective lens, the primary electron acceleration means and the primary electron deceleration means so as to converge the secondary electrons to an entrance of the spectroscope, with a lens formed with the objective lens, the primary electron acceleration means and the primary electron deceleration means.

2. The scanning electron microscope according to claim 1, wherein the spectroscope is a sector type spectroscope.

3. The scanning electron microscope according to claim 1, wherein the controller is configured to set an excitation current for the objective lens and an application voltage to the primary electron acceleration means and the primary electron deceleration means so as to obtain a spectrum of the secondary electrons with the detector at a highest signal/noise ratio.

4. A scanning electron microscope comprising:
an electron source;
an objective lens that converges primary electrons emitted from the electron source on a sample;
primary electron acceleration means that accelerates the primary electrons and passes them through the objective lens;
primary electron deceleration means that decelerates the primary electrons and irradiates them to the sample;
a secondary electron deflector that deflects secondary electrons from the sample, caused with the primary electrons converged with the objective lens, to the outside of an optical axis of the primary electrons;
a spectroscope for dispersion of the secondary electrons;
a first detector that detects the secondary electrons passed through the spectroscope;
a second detector that detects tertiary electrons caused by irradiation of the secondary electrons to an entrance slit of the spectroscope; and
a controller that controls application voltage to the secondary electron deflector so as to scan the secondary electrons on the entrance slit, to obtain a scan image of the entrance slit using a detection signal of the tertiary electrons detected with the second detector.

5. The scanning electron microscope according to claim 4, further comprising a processor that calculates sharpness of the scan image of the entrance slit,
wherein the controller sets application voltage to the primary electron acceleration means and the primary electron deceleration means so as to obtain a sharpest scan image of the entrance slit.

6. The scanning electron microscope according to claim 4, further comprising:
a deflector for deflection of the primary electrons; and
a conversion plate, installed on the opposite side to the spectroscope with an optical axis of the primary electrons between them, for collision of the secondary electrons,
wherein the second detector is also used for detection of tertiary electrons caused by irradiation of the secondary electrons to the conversion plate, and
wherein the controller controls application voltage to the secondary electron deflector, so as to deflect the secondary electrons to the conversion plate side to obtain a scan image of the sample and to deflect the secondary electrons to the spectroscope side to obtain a secondary electron spectrum of the sample.

7. The scanning electron microscope according to claim 6, further comprising a display unit that displays a secondary electron spectrum obtained by designating an arbitrary point in a displayed scan image of the sample and irradiating the primary electrons to the designated arbitrary point.

8. The scanning electron microscope according to claim 6, further comprising a processor that calculates sharpness of the scan image of the sample and sharpness of a scan image of the entrance slit,
wherein the controller calculates an excitation current value for the objective lens to obtain the sharpest scan image of the sample and a voltage value applied to the primary electron acceleration means or the primary electron deceleration means to obtain the sharpest scan image of the entrance slit, and outputs the current value and the voltage value.

9. The scanning electron microscope according to claim 6, further comprising a processor that calculates sharpness of the scan image of the sample and sharpness of the scan image of the entrance slit,
wherein the controller calculates a voltage value applied to the primary electron acceleration means or the primary electron deceleration means to obtain the sharpest scan image of the sample and an excitation current value for the objective lens to obtain the sharpest scan image of the entrance slit, and outputs the current value and the voltage value.

10. The scanning electron microscope according to claim 4,
wherein the controller controls application voltage to at least one of the objective lens, the primary electron acceleration means, and the primary electron deceleration means so as to converge the secondary electrons to an entrance of the spectroscope with a lens formed with the objective lens, the primary electron acceleration means and the primary electron deceleration means.

11. The scanning electron microscope according to claim 4, further comprising:
a deflector for deflection of the primary electrons; and
a third detector for detection of the secondary electrons on the opposite side to the spectroscope with the optical axis of the primary electrons between them,
wherein the controller controls application voltage to the secondary electron deflector so as to deflect the secondary electrons to the third detector side to obtain a scan image of the sample and to deflect the secondary electrons to the spectroscope side to obtain a secondary electron spectrum of the sample.

12. An electron orbit control method for a scanning electron microscope having an electron source, an objective lens that converges primary electrons emitted from the electron source on a sample, primary electron acceleration means that accelerates the primary electrons and passes them through the objective lens, primary electron department means that decelerates the primary electrons and irradiates them to the sample, a secondary electron deflector that deflects secondary electrons from the sample, caused with the primary electrons converged with the objective lens, to the outside of an optical axis of the primary electrons a spectroscope for dispersion of the secondary electrons, a first detector that detects the secondary electrons passed through the spectroscope, a second detector that detects tertiary electrons caused by irradiation of the secondary electrons to an entrance slit of the spectroscope and a controller that controls application voltage to the secondary electron deflector so as to scan the secondary electrons on the entrance slit, to obtain a scan image of the entrance slit using a detection signal of the tertiary electrons detected with the second detector, the method comprising:
a first step of applying voltage to the primary electron acceleration means;
a second step of deflecting the secondary electrons with the secondary electron deflector to the spectroscope side;
a third step of detecting the tertiary electrons with the second detector, to obtain a scan image of an entrance slit of the spectroscope;
a fourth step of calculating sharpness of the scan image;
a step of repeating the first step to the fourth step; and
a step of setting voltage of the primary electron acceleration means to obtain the highest sharpness as application voltage to the primary electron acceleration means.

* * * * *